United States Patent
Keel et al.

(10) Patent No.: US 11,810,941 B2
(45) Date of Patent: Nov. 7, 2023

(54) 3D IMAGE SENSOR

(71) Applicant: SAMSUNG ELECTRONICS CO., LTD., Suwon-si (KR)

(72) Inventors: Min-Sun Keel, Seoul (KR); Doo Won Kwon, Seongnam-si (KR); Hyun Surk Ryu, Hwaseong-si (KR); Young Chan Kim, Seongnam-si (KR); Young Gu Jin, Suwon-si (KR)

(73) Assignee: Samsung Electronics Co., Ltd.

( * ) Notice: Subject to any disclaimer, the term of this patent is extended or adjusted under 35 U.S.C. 154(b) by 149 days.

(21) Appl. No.: 17/217,167

(22) Filed: Mar. 30, 2021

(65) Prior Publication Data

US 2021/0217802 A1    Jul. 15, 2021

Related U.S. Application Data

(63) Continuation of application No. 16/124,226, filed on Sep. 7, 2018, now Pat. No. 10,991,748.

(30) Foreign Application Priority Data

Mar. 9, 2018  (KR) ................. 10-2018-0027839

(51) Int. Cl.

| | |
|---|---|
| *H01L 27/146* | (2006.01) |
| *H01L 23/00* | (2006.01) |
| *H04N 13/204* | (2018.01) |
| *G06T 7/521* | (2017.01) |
| *H04N 25/75* | (2023.01) |

(52) U.S. Cl.
CPC ........ *H01L 27/14647* (2013.01); *H01L 24/05* (2013.01); *H01L 24/13* (2013.01);
(Continued)

(58) Field of Classification Search
CPC ......... H01L 2224/13147; H01L 27/146; H01L 24/16
See application file for complete search history.

(56) References Cited

U.S. PATENT DOCUMENTS

| | | |
|---|---|---|
| 8,399,848 B2 | 3/2013 | Frach et al. |
| 9,076,706 B2 | 7/2015 | Kim et al. |

(Continued)

FOREIGN PATENT DOCUMENTS

| | | |
|---|---|---|
| JP | 2009014461 A1 | 1/2009 |
| KR | 1020160082788 A | 7/2016 |

(Continued)

OTHER PUBLICATIONS

A Rolling-Shutter Distortion-Free 3D Stacked Image Sensor with—160dB Parasitic Light Sensitivity In-Pixel Storage Node.
(Continued)

*Primary Examiner* — Dale E Page
*Assistant Examiner* — Wilner Jean Baptiste
(74) *Attorney, Agent, or Firm* — Fish & Richardson P.C.

(57) ABSTRACT

A three-dimensional (3D) image sensor includes a first substrate having an upper pixel. The upper pixel includes a photoelectric element and first and second photogates connected to the photoelectric element. A second substrate includes a lower pixel, which corresponds to the upper pixel, that is spaced apart from the first substrate in a vertical direction. The lower pixel includes a first transfer transistor that transmits a first signal provided by the first photogate. A first source follower generates a first output signal in accordance with the first signal. A second transfer transistor transmits a second signal provided by the second photogate. A second source follower generates a second output signal in accordance with the second signal. First and second bonding conductors are disposed between the first and second substrates and electrically connect the upper and lower pixels.

19 Claims, 14 Drawing Sheets

(52) U.S. Cl.
CPC ........ *H01L 24/16* (2013.01); *H01L 27/14612* (2013.01); *H01L 27/14634* (2013.01); *H01L 27/14636* (2013.01); *H04N 13/204* (2018.05); *G06T 7/521* (2017.01); *G06T 2207/10024* (2013.01); *G06T 2207/10028* (2013.01); *H01L 24/14* (2013.01); *H01L 2224/0401* (2013.01); *H01L 2224/05554* (2013.01); *H01L 2224/06131* (2013.01); *H01L 2224/13013* (2013.01); *H01L 2224/13016* (2013.01); *H01L 2224/13147* (2013.01); *H01L 2224/14131* (2013.01); *H01L 2224/16014* (2013.01); *H01L 2224/16145* (2013.01); *H04N 25/75* (2023.01)

(56) References Cited

U.S. PATENT DOCUMENTS

| | | | |
|---|---|---|---|
| 9,412,725 | B2 | 8/2016 | Chen et al. |
| 9,437,633 | B2 | 9/2016 | Chao et al. |
| 2011/0156197 | A1 | 6/2011 | Tivarus et al. |
| 2016/0099273 | A1 | 4/2016 | Agranov et al. |
| 2016/0190198 | A1* | 6/2016 | Kwon ................ H01L 27/1464 257/435 |
| 2017/0094260 | A1 | 3/2017 | Agranov et al. |

FOREIGN PATENT DOCUMENTS

| | | |
|---|---|---|
| KR | 1020170014682 A | 2/2017 |
| WO | WO2016111010 A1 | 10/2017 |

OTHER PUBLICATIONS

Aoki, Jun et al., "A Rolling Shutter Distortion-Free 3D Stacked Image Sensor with—160dB Parasitic Light Sensitivity In-Pixel Storage Node," 2013 IEEE International Solid-State Circuits Conference Digest of Technical Papers.

Korean Notice of Allowance dated Mar. 16, 2023,Cited in Corresponding Korean Application No. KR 10-2018-0027839.

* cited by examiner

3D IMAGE SENSOR

This is a Continuation of U.S. application Ser. No. 16/124,226, filed Sep. 7, 2018, and a claim of priority is made to Korean Patent Application No. 10-2018-0027839, filed on Mar. 9, 2018, and all the benefits accruing therefrom under 35 U.S.C. § 119, the disclosures of which are incorporated herein by reference in their entireties.

BACKGROUND

1. Field

The present disclosure relates to a three-dimensional (3D) image sensor.

2. Description of the Related Art

As digital cameras, digital camcorders, and mobile phones having a camera or camcorder function have been widely used, developments have recently been made in the field of image sensors. Image sensors are semiconductor devices for converting an optical image into an electric signal. Since the demand for stereoscopic images has increased, research has been vigorously conducted on three-dimensional (3D) image sensors capable of capturing both color images and depth images, i.e., depth sensors.

Since depth sensors generally have larger pixels than typical image sensors, the size of an entire device including the pixels may increase. In order to address this problem, a method is needed to reduce the size of pixels and thus to improve the integration density and efficiency of an image sensor.

SUMMARY

Example embodiments of the present disclosure provide a three-dimensional (3D) image sensor having the size of pixels thereof reduced and thus having an improved integration density.

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

According to an example embodiment of the present disclosure, there is provided a 3D image sensor including a first substrate including an upper pixel, the upper pixel including a photoelectric element and first and second photogates connected to the photoelectric element; a second substrate including a lower pixel, which corresponds to the upper pixel, and spaced apart from the first substrate in a vertical direction, the lower pixel including a first transfer transistor transmitting a first signal provided by the first photogate, a first source follower generating a first output signal in accordance with the first signal, a second transfer transistor transmitting a second signal provided by the second photogate, and a second source follower generating a second output signal in accordance with the second signal; and first and second bonding conductors disposed between the first and second substrates and electrically connecting the upper and lower pixels.

According to another example embodiment of the present disclosure, there is provided a 3D image sensor including a pixel array divided between a first substrate and a second substrate, which is disposed below the first substrate, and in which a plurality of pixels is arranged in rows in a first direction and in columns in a second direction; and a bonding conductor array connecting the first and second substrates and in which a plurality of bonding conductors is arranged in rows in a third direction and in columns in a fourth direction that is orthogonal to the third direction, wherein two bonding conductors are disposed for each of the plurality of the pixels, and the first and third directions are inclined at an angle of 45°.

According to still another example embodiment of the present disclosure, there is provided a 3D image sensor including a first substrate including an upper pixel array; a second substrate including a lower pixel array and disposed below the first substrate; and bonding conductors forming a pixel array by connecting the upper and lower pixel arrays, wherein each of the bonding conductors includes a first pad disposed on a bottom surface of the first substrate, a first conductive ball disposed below the first pad, a second pad formed on a top surface of the second substrate, and a second conductive ball placed in contact with the first conductive ball, and a direction in which the pixel array is aligned is inclined with respect to a direction in which the bonding conductors are aligned.

According to still another example embodiment of the present disclosure, there is provided a three-dimensional image sensor having a pixel with a first sub-pixel disposed on a first substrate and a second sub-pixel disposed on a second substrate. A bonding conductor directly, electrically connects the first sub-pixel and the second sub-pixel and is disposed directly between the first substrate and the second substrate.

Other features and example embodiments may be apparent from the following detailed description, the drawings, and the claims.

BRIEF DESCRIPTION OF THE DRAWINGS

The above and other example embodiments and features of the present disclosure will become more apparent by describing in detail example embodiments thereof with reference to the attached drawings, in which.

DETAILED DESCRIPTION

An image sensor according to some example embodiments of the present disclosure will hereinafter be described with reference to FIGS. 1 through 11.

Figure 1:
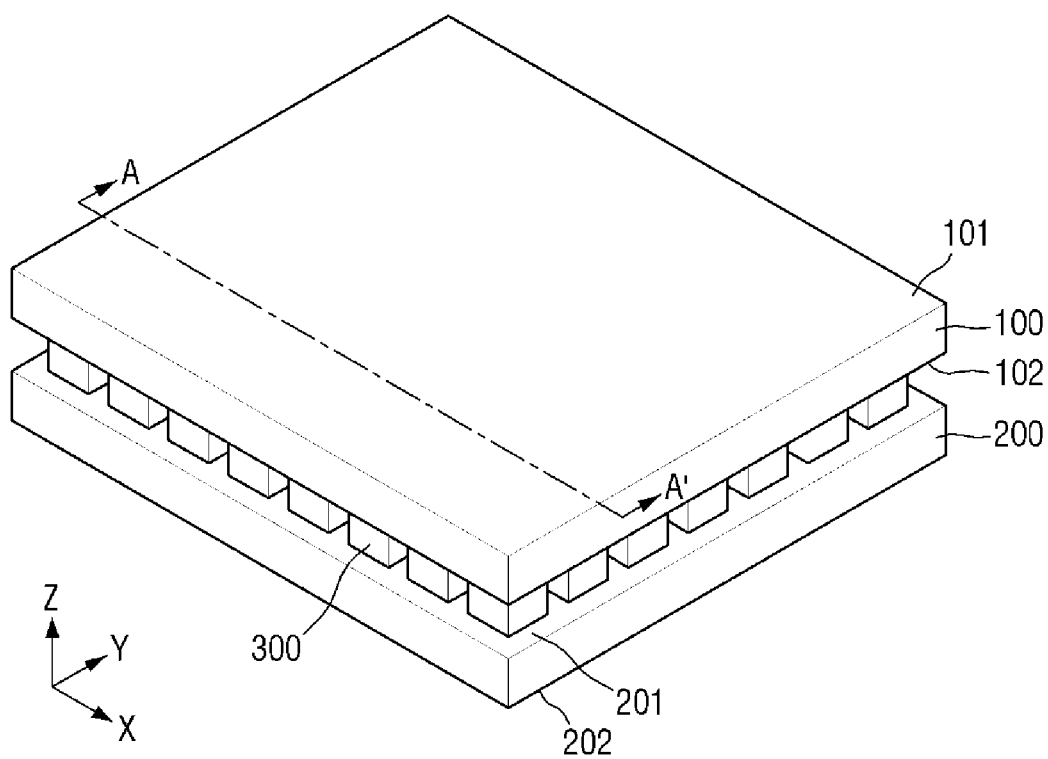
FIG. 1 is a perspective view of a three-dimensional (3D) image sensor according to some example embodiments of the present disclosure.

FIG. 1 is a perspective view of a three-dimensional (3D) image sensor according to some example embodiments of the present disclosure.

Referring to FIG. 1, the 3D image sensor according to some example embodiments of the present disclosure includes a first substrate 100, a second substrate 200, and bonding conductors 300.

The first substrate 100 may be disposed on a horizontal plane. The horizontal plane may be defined by first and second directions X and Y. Specifically, the first and second directions X and Y may be orthogonal to each other. The first and second directions X and Y may be directions defining the width and the length of the first substrate 100. The first substrate 100 may be disposed on a plane defined by the first and second directions X and Y.

A third direction Z may be a direction orthogonal to both the first and second directions X and Y. Thus, the first, second, and third directions X, Y, and Z may be orthogonal to one another. If the plane defined by the first and second directions X and Y is the horizontal plane, the third direction Z may be defined as a vertical direction.

The first substrate 100 may include a first top surface 101 and a first bottom surface 102. The first top surface 101 and the first bottom surface 102 of the first substrate 100 may be surfaces of the first substrate 100 that are opposite to each other in the third direction Z.

The second substrate 200 may be spaced apart from the first substrate 100 in the third direction Z. That is, the second substrate 200 may be disposed below the first substrate 100. The second substrate 200 may correspond to the first substrate 100. Specifically, the second substrate 200 may completely overlap with the first substrate 100 in the third direction Z. The first and second substrates 100 and 200 may share the same horizontal cross-section and may completely overlap with each other, but the present disclosure is not limited thereto.

The second substrate 200 may include a second top surface 201 and a second bottom surface 202. The second top surface 201 and the second bottom surface 202 of the second substrate 200 may be surfaces of the second substrate 200 that are opposite to each other in the third direction Z.

The bonding conductors 300 may be disposed between the first and second substrates 100 and 200. The bonding conductors 300 may be placed in contact with the first bottom surface 102 of the first substrate and the second top surface 201 of the second substrate 200. That is, the bonding conductors 300 may be disposed between the first and second substrates 100 and 200 along the third direction Z.

The bonding conductors 300 may electrically connect the first and second substrates 100 and 200. The bonding conductors 300 may comprise a conductor. The bonding conductors 300 may comprise, for example, copper (Cu), but the present disclosure is not limited thereto.

A plurality of bonding conductors 300 may be provided. The plurality of bonding conductors 300 may be aligned to form a bonding conductor array, and this will be described later in detail.

Figure 2:
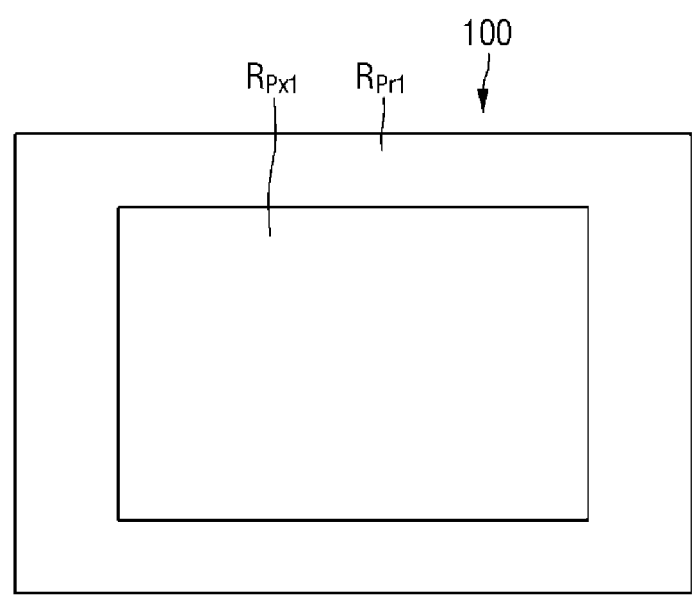
FIG. 2 is a plan view of a first substrate of the 3D image sensor of FIG. 1.

FIG. 2 is a plan view of the first substrate of the 3D image sensor of FIG. 1.

Referring to FIG. 2, the first substrate 100 may have a first pixel region $R_{Px1}$ and a first peripheral region $R_{Pr1}$.

The first pixel region $R_{Px1}$ may be a region in which the pixels of the 3D image sensor according to some example embodiments of the present disclosure are disposed. The first pixel region $R_{Px1}$ may be surrounded by the first peripheral region $R_{Pr1}$ in a plan view. The first pixel region $R_{Px1}$ may be a region receiving light from the outside.

The first peripheral region $R_{Pr1}$ may surround the first pixel region $R_{Px1}$. That is, the first peripheral region $R_{Pr1}$ may be the peripheral region of the first pixel region $R_{Px1}$. In the first peripheral region $R_{Pr1}$, circuits that process signals generated in the first pixel region $R_{Px1}$ may be disposed.

Figure 3:
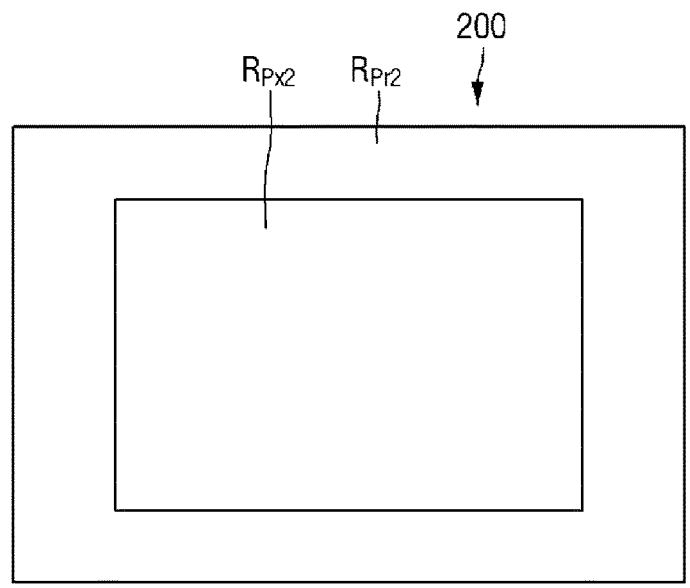
FIG. 3 is a plan view of a second substrate of the 3D image sensor of FIG. 1.

FIG. 3 is a plan view of the second substrate of the 3D image sensor of FIG. 1.

Referring to FIG. 3, the second substrate 200 may have a second pixel region $R_{Px2}$ and a second peripheral region $R_{Pr2}$.

The second pixel region $R_{Px2}$ may be a region in which the pixels of the 3D image sensor according to some example embodiments of the present disclosure are disposed. The second pixel region $R_{Px2}$ may be surrounded by the second peripheral region $R_{Pr2}$ in a plan view. The second pixel region $R_{Px2}$ may be a region receiving light from the outside.

The second peripheral region $R_{Pr2}$ may surround the second pixel region $R_{Px2}$. That is, the second peripheral region $R_{Pr2}$ may be the peripheral region of the second pixel region $R_{Px2}$. In the second peripheral region $R_{Pr2}$, circuits that process signals generated in the second pixel region $R_{Px2}$ may be disposed.

Referring to FIGS. 1 through 3, the first and second pixel regions $R_{Px1}$ and $R_{Px2}$ may overlap with each other in the third direction Z. Also, the first and second peripheral regions $R_{Pr1}$ and $R_{Pr2}$ may overlap with each other in the third direction Z. That is, the pixel regions of the first and second substrates 100 and 200 may be disposed to overlap with each other, and the peripheral regions of the first and second substrates 100 and 200 may be disposed to overlap with each other.

The bonding conductors 300 may connect the first and second pixel regions $R_{Px1}$ and $R_{Px2}$, and may connect the first and second peripheral regions $R_{Pr1}$ and $R_{Pr2}$. The first and second pixel regions $R_{Px1}$ and $R_{Px2}$ may be connected together by the bonding conductors 300 and may thus form a complete pixel region. That is, the complete pixel region may be divided into the first and second pixel regions $R_{Px1}$ and $R_{Px2}$ of the first and second substrates 100 and 200, and the first and second pixel regions $R_{Px1}$ and $R_{Px2}$ may be connected together by the bonding conductors 300.

Figure 4:
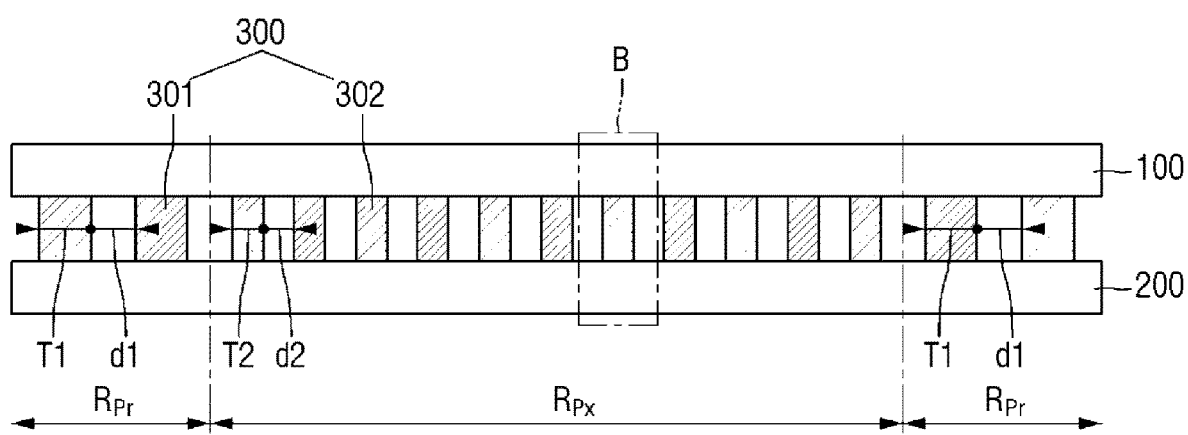
FIG. 4 is a cross-sectional view taken along line A-A' of FIG. 1.

FIG. 4 is a cross-sectional view taken along line A-A' of FIG. 1.

Referring to FIGS. 1 through 4, the bonding conductors 300 include peripheral bonding conductors 301 and pixel bonding conductors 302.

The peripheral bonding conductors 301 may be formed in a peripheral region $R_{Pr}$. The peripheral region $R_{Pr}$ may be a region defined by the first and second peripheral regions $R_{Pr1}$ and $R_{Pr2}$ overlapping with each other in the third direction Z. The pixel bonding conductors 302 may be formed in a pixel region $R_{Px}$. The pixel region $R_{Px}$ may be a region defined by the first and second pixel regions $R_{Px1}$ and $R_{Px2}$ overlapping with each other in the third direction Z.

That is, the pixel region $R_{Px}$ may be surrounded by the peripheral region $R_{Pr}$. The pixel region $R_{Px}$ and the peripheral region $R_{Pr}$ may be defined commonly on both the first and second substrates 100 and 200.

The peripheral bonding conductors 301 of the peripheral region $R_{Pr}$ may have a first thickness T1. A plurality of peripheral bonding conductors 301 may be provided in the peripheral region $R_{Pr}$. The plurality of peripheral bonding conductors 301 may be uniformly spaced apart from one another by a first distance d1.

The pixel bonding conductors 302 of the pixel region $R_{Px}$ may have a second thickness T2. A plurality of pixel bonding conductors 302 may be provided in the pixel region $R_{Px}$. The plurality of pixel bonding conductors 302 may be uniformly spaced apart from one another by a second distance d2.

Since the peripheral region $R_{Pr}$ may have more room for the arrangement of the bonding conductors 300 than the pixel region $R_{Px}$, the first thickness T1 may be greater than the second thickness T2, but the present disclosure is not limited thereto. Thus, by making the thickness of the peripheral bonding conductors 301 greater than the thickness of the pixel bonding conductors 302, the connection resistance between the first and second substrates 100 and 200 can be reduced in the peripheral region $R_{Pr}$. As a result, the reliability of signals transmitted between the first and second substrates 100 and 200 can be further improved in the peripheral region $R_{Pr}$.

Since the peripheral region $R_{Pr}$ may have more room for the arrangement of the bonding conductors 300 than the pixel region $R_{Px}$, the first distance d1 may be greater than the second distance d2, but the present disclosure is not limited thereto. Thus, by making the distance between the peripheral bonding conductors 301 greater than the distance between the pixel bonding conductors 302, the formation of the bonding conductors 300 can be simplified, and the risk of misalignment can be reduced. As a result, the reliability of signals transmitted between the first and second substrates 100 and 200 can be further improved in the peripheral region $R_{Pr}$.

Figure 5:
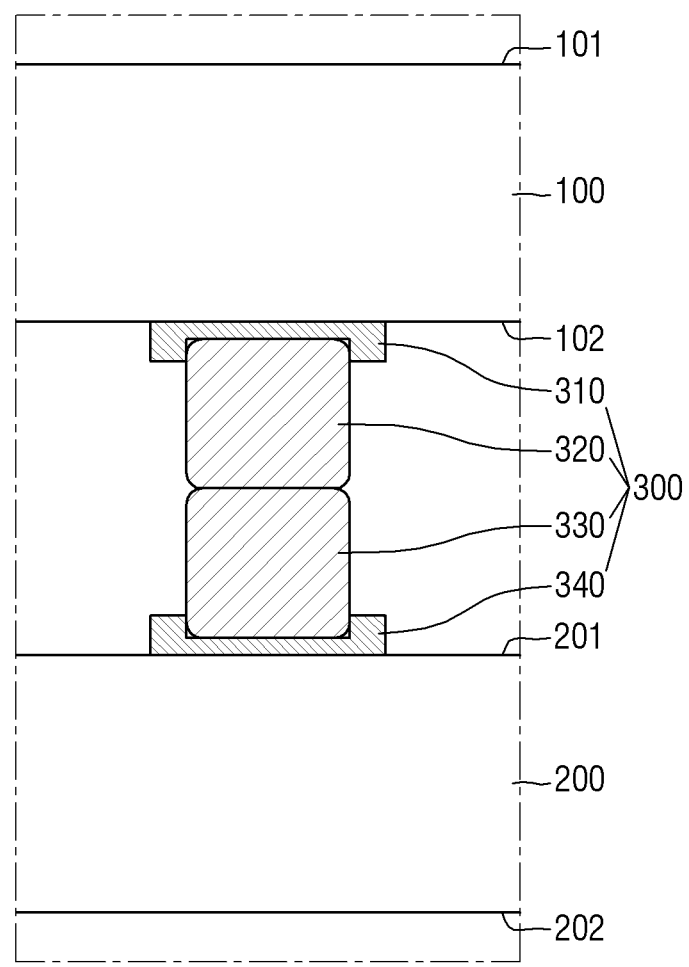
FIG. 5 is an enlarged cross-sectional view of part B of FIG. 4.

FIG. 5 is an enlarged cross-sectional view of part B of FIG. 4.

Referring to FIG. 5, a bonding conductor 300 may include a first pad 310, a first conductive ball 320, a second pad 340, and a second conductive ball 330.

The first pad 310 may be disposed on the first bottom surface 102 of the first substrate 100. The first pad 310 may be connected to wires and via structures formed in the first substrate 100 and may thus be electrically connected to circuits disposed on the first substrate 100.

The second pad 340 may be disposed on the second top surface 201 of the second substrate 200. The second pad 340 may be connected to wires and via structures formed in the second substrate 200 and may thus be electrically connected to circuits disposed on the second substrate 200.

The first conductive ball 320 may be disposed on an exposed surface of the first pad 310, i.e., below the first substrate 100. The first conductive ball 320 may be placed in direct contact with, and electrically connected to, the first pad 310.

The second conductive ball 330 may be disposed on an exposed surface of the second pad 340, i.e., above the second substrate 200. The second conductive ball 330 may be placed in direct contact with, and electrically connected to, the second pad 340.

The first and second conductive balls 320 and 330 may be placed in contact with each other in a vertical direction, i.e., the third direction Z. Since the first and second conductive balls 320 and 330 are placed in contact with each other, the first and second substrates 100 and 200 may be electrically connected. Specifically, electric signals may be transmitted between the first and second substrates 100 and 200 via the first pad 310, the first conductive ball 320, the second conductive ball 330, and the second pad 340.

The size and the arrangement of, and the distance between, the peripheral bonding conductors 301 and the size and the arrangement of, and the distance between, the pixel bonding conductors 302 may vary, but the structure of the bonding conductor 300 of FIG. 5 may directly apply to both the peripheral bonding conductors 301 and the pixel bonding conductors 302.

Figure 6:
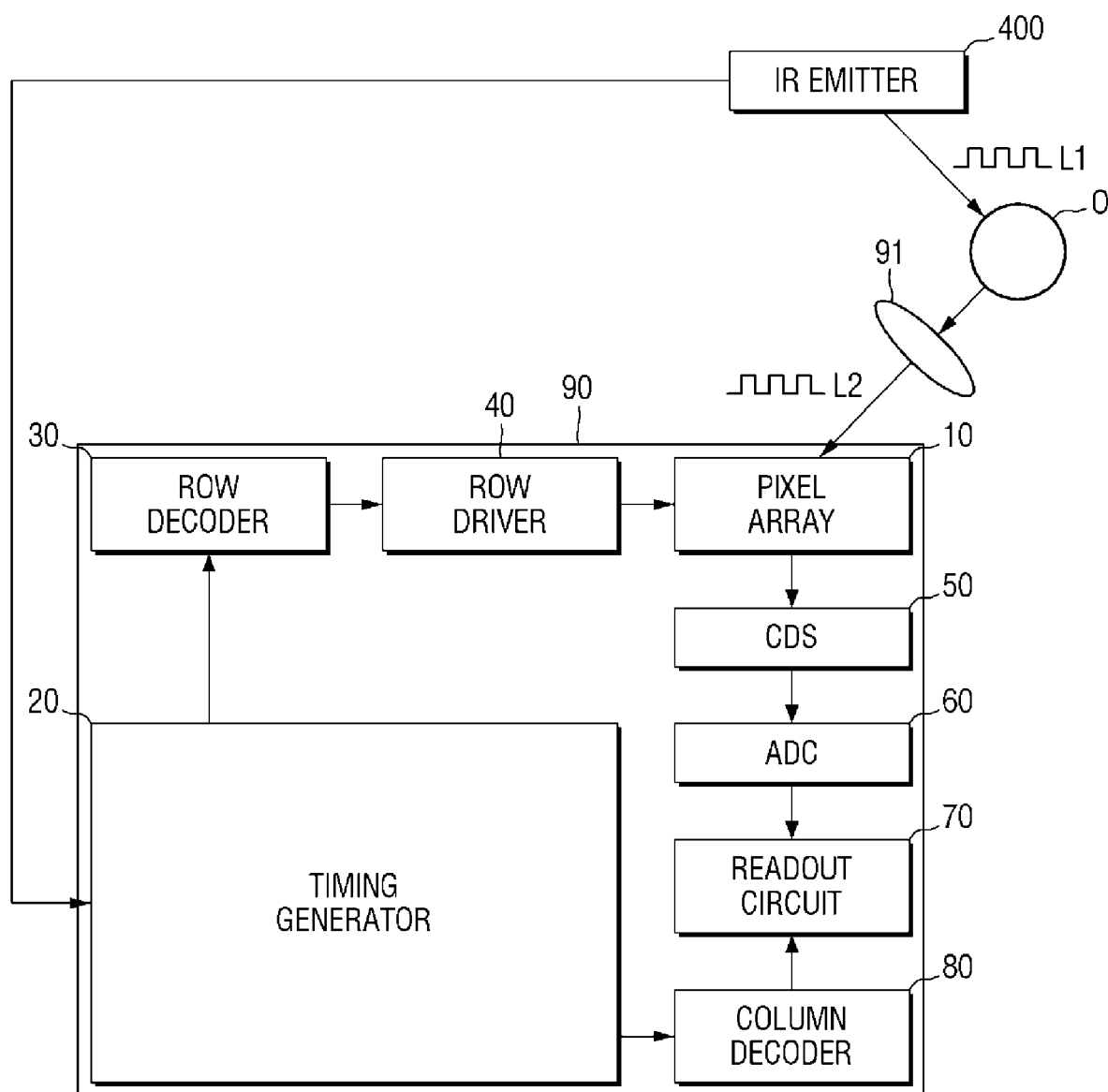
FIG. 6 is a block diagram of an image sensing apparatus including the 3D image sensor according to some example embodiments of the present disclosure.

FIG. 6 is a block diagram of an image sensing apparatus including the 3D image sensor according to some example embodiments of the present disclosure.

Referring to FIG. 6, the image sensing apparatus includes an infrared (IR) emitter 400 and a 3D image sensor 90.

The IR emitter 400 may apply a pulse signal L1 to an object O. The pulse signal L1 may be IR light. The pulse signal L1 may be reflected by the object O, and as a result, a reflected pulse signal L2 may return to the 3D image sensor 90 via a lens 91. The IR emitter 400 may transmit information regarding the pulse signal L1 to the 3D image sensor 90.

The 3D image sensor 90 may analyze color information and distance information of the object O, i.e., 3D image information of the object O, using the reflected pulse signal L2.

Specifically, the 3D image sensor 90 includes a pixel array 10, in which pixels each having a photoelectric element are arranged two-dimensionally, a timing generator 20, a row decoder 30, a row driver 40, a correlated double sampler (CDS) 50, an analog-to-digital converter (ADC) 60, a readout circuit (e.g., latch) 70, and a column decoder 80.

The pixel array 10 may include a plurality of pixels which is arranged two-dimensionally. The plurality of pixels converts an optical image into an electric output signal. The pixel array 10 may receive the reflected pulse signal L2 via the lens 91.

The pixel array 10 may be driven by receiving a plurality of driving signals such as a row selection signal, a reset signal, and a charge transfer signal from the row driver 40. The electric output signal obtained by the pixel array 10 is provided to the CDS 50 via a vertical signal line.

The timing generator 20 provides a timing signal and a control signal to the row decoder 30 and the column decoder 80. The timing generator 20 may receive information regarding the pulse signal L1 from the IR emitter 400.

The row decoder 30 may generate driving signals for driving each row of pixels of the pixel array 10 such as, for example, a transfer signal, a reset signal, and a select signal, and a gate signal.

The row driver 40 may provide a plurality of driving signals for the plurality of pixels to the pixel array 10 in accordance with the result of decoding performed by the row decoder 30. In a case where the plurality of pixels is arranged in a matrix having a plurality of rows, the row driver 40 may provide the plurality of driving signals in units of the plurality of rows.

The CDS 50 may receive the output signal of the pixel array 10 via the vertical signal line and may hold and sample the received signal. That is, the CDS 50 may double-sample a particular noise level and the level of the output signal of the pixel array 10 and may output the difference between the particular noise level and the output signal of the pixel array 10.

The ADC 60 may convert an analog signal corresponding to the difference between the particular noise level and the output signal of the pixel array 10 into a digital signal and may output the digital signal.

A read-out circuit 70 may perform image processing on the digital signal output by the ADC 60 in accordance with the result of decoding performed by the row decoder 30. As a result, the read-out circuit 70 may obtain the color information and the depth information of the object O.

The CDS 50, the ADC 60, the read-out circuit 70, the row driver 40, the row decoder 30, and the column decoder 80 may be disposed in the peripheral region $R_{Pr}$ of FIG. 4, but the present disclosure is not limited thereto.

Figure 7:
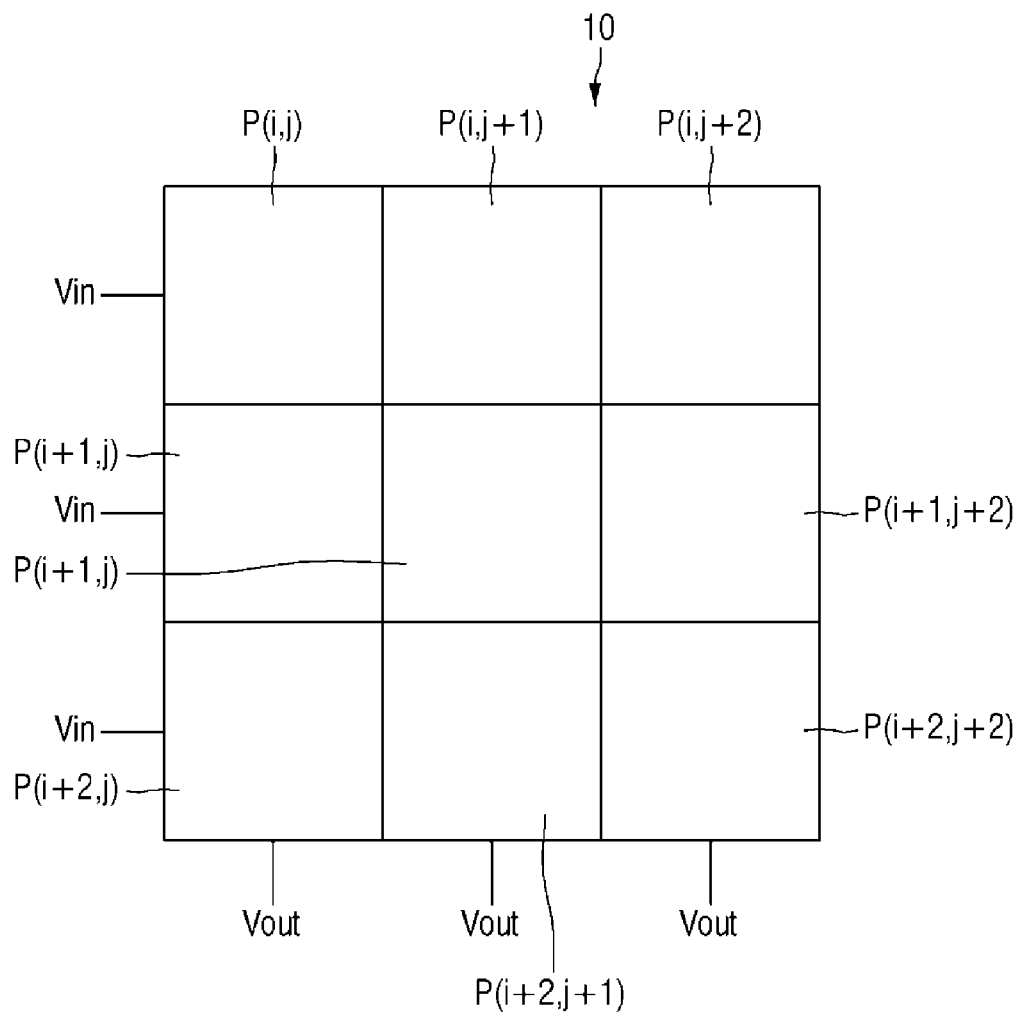
FIG. 7 is a layout view of a pixel array of FIG. 6.

FIG. 7 is a layout view of the pixel array of FIG. 6.

Referring to FIGS. 1 through 3 and 7, in the pixel array 10, a plurality of pixels may be aligned in rows and columns. Referring to FIG. 7, a pixel P(i,j) refers to a pixel in an i-th row and a j-th column. FIG. 7 illustrates an example in which there are three rows and three columns of pixels in the pixel array 10, but the present disclosure is not limited thereto. That is, the numbers of rows and columns of pixels in the pixel array 10 may vary.

The pixel P(i,j) may be disposed in the pixel region $R_{Px}$. The pixel P(i,j) may be divided between the first and second pixel regions $R_{Px1}$ and $R_{Px2}$. Part of the pixel P(i,j) disposed in the first pixel region $R_{Px1}$, i.e., an upper pixel, and part of the pixel P(i,j) disposed in the second pixel region $R_{Px2}$, i.e., a lower pixel, may overlap with each other in the vertical direction, i.e., the third direction Z. Thus, the planar arrangement of the pixel array 10 may be defined within a given horizontal area, as shown in FIG. 7, regardless of the division of the pixel P(i,j) into upper and lower pixels.

The pixel P(i,j) may be rectangular in shape, but the present disclosure is not limited thereto. The pixel P(i,j) may be disposed to adjoin other pixels on the sides thereof.

The P(i,j) may receive an input Vin and may produce an output Vout. The input Vin may be provided to the pixel array 10 in units of the rows of the pixel array 10, and the output Vout may be produced in units of the columns of the pixel array 10.

Figure 8:
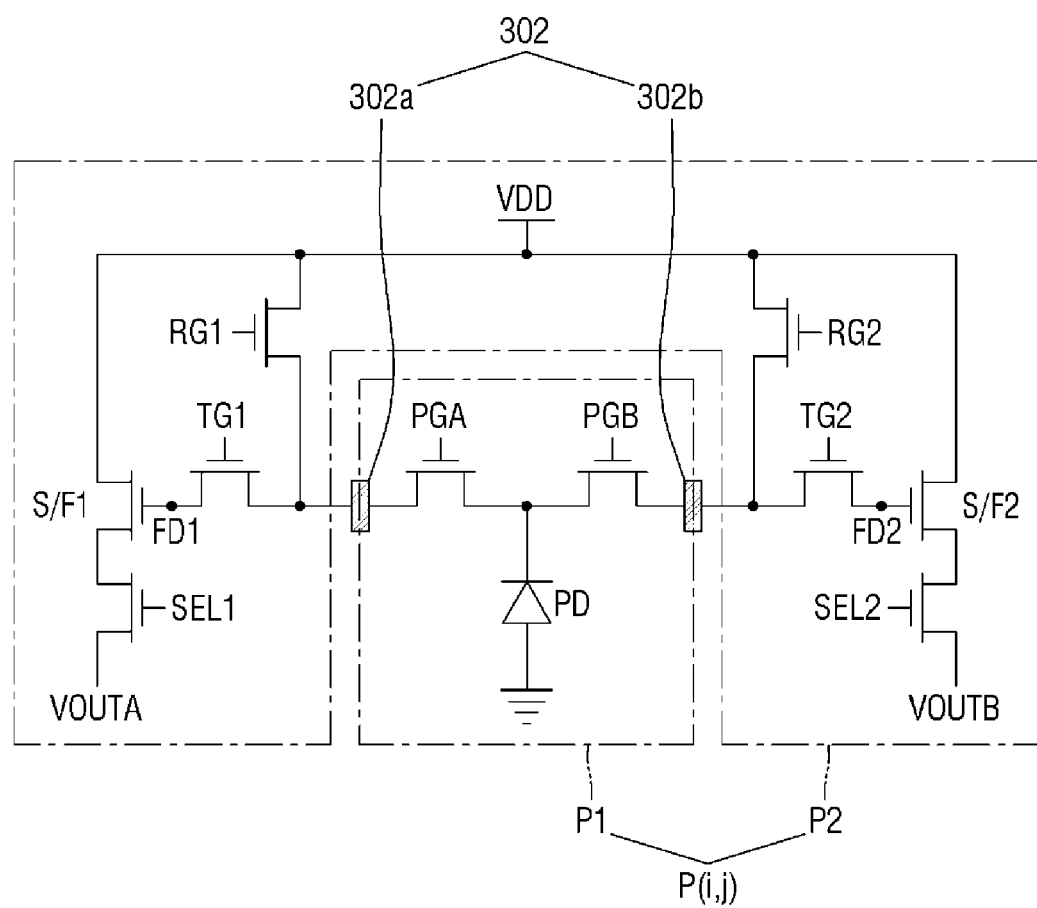
FIG. 8 is an equivalent circuit diagram of an example pixel of the pixel array of FIG. 6.

FIG. 8 is an equivalent circuit diagram of an example pixel of the pixel array of FIG. 6.

Referring to FIG. 8, the pixel P(i,j) may include an upper pixel P1, a lower pixel P2, and pixel bonding conductors 302.

The upper pixel P1 may be formed in the first pixel region $R_{Px1}$ of the first substrate 100. The lower pixel P2 may be formed in the second pixel region $R_{Px2}$ of the second substrate 200. The upper and lower pixels P1 and P2, which are the elements of the pixel P(i,j), are divided between two substrates, and as a result, the horizontal area of the pixel P(i,j) can be minimized.

The pixel bonding conductors 302 may electrically connect the upper and lower pixels P1 and P2. The pixel bonding conductors 302 may include first and second pixel bonding conductors 302a and 302b. That is, two pixel bonding conductors 302 may be provided for the pixel P(i,j) because the pixel P(i,j) is a 2-tap pixel having two photogates.

If the pixel P(i,j) is a 3- or 4-tap pixel having three or four photogates, three or four pixel bonding conductors 302 may be provided for the pixel P(i,j). That is, the number of photogates provided in the pixel P(i,j) may be the same as the number of pixel bonding conductors 302 provided in the pixel P(i,j).

The upper pixel P1 may include a photoelectric element PD, a first photogate PGA, and a second photogate PGB. The lower pixel P2 may include a first transfer transistor TG1, a second transfer transistor TG2, a first reset transistor RG1, a second reset transistor RG2, a first source follower S/F1, a second source follower S/F2, a first select transistor SEL1, and a second select transistor SEL2.

The photoelectric element PD may be an element that converts light applied thereto into electric charges. The photoelectric element PD may convert light into an electric signal working with the first and second photogates PGA and PGB.

Specifically, the photoelectric element PD may sense light. The photoelectric element PD may generate electron-hole pairs (EHPs) based on the sensed light. A depletion region is formed by a gate voltage applied to the first photogate PGA, and due to the depletion region, the electrons and holes of the EHPs are separated. The separated electrons are accumulated below the first photogate PGA.

The first photogate PGA is connected to the drain of the first transfer transistor TG1, and a first floating diffusion region FD1 is connected to the source of the first transfer transistor TG1. The first transfer transistor TG1 transmits the electrons below the first photogate PGA in response to the gate voltage applied to the first photogate PGA. The first transfer transistor TG1 electrically connects or disconnects the first photogate PGA and the first floating diffusion region FD1 in response to a gate signal.

The first floating diffusion region FD1 is connected to the gate of the first source follower S/F1, a power supply voltage VDD is connected to the drain of the first source follower S/F1, and the first select transistor SEL1 is connected to the source of the first source follower S/F1. The voltage of the source of the first source follower S/F1 is determined by the voltage of the first floating diffusion region FD1. The voltage of the first floating diffusion region FD1 is determined by the amount of electrons transmitted from the first photogate PGA.

A row control signal is connected to the gate of the first select transistor SEL1, the source of the first source follower S/F1 is connected to the drain of the first select transistor SEL1, and an output line of the pixel array 10 is connected to the source of the first select transistor SEL1.

The power supply voltage VDD is connected to the drain of the first reset transistor RG1, and the first floating diffusion region FD1 is connected to the source of the first reset transistor RG1 through the first transfer transistor TG1. When the detection of pixel information is performed based on the voltage of the first floating diffusion region FD1 and then the gate of the first reset transistor RG1 is activated by a first reset signal, the first reset transistor RG1 resets the voltage of the first floating diffusion region FD1 to the power supply voltage VDD.

When the photoelectric element PD senses light, a depletion region is formed by a gate voltage applied to the second photogate PGB, and due to the depletion region, the electrons and holes of EHPs are separated. The separated electrons are accumulated below the second photogate PGB.

The second photogate PGB is connected to the drain of the second transfer transistor TG2, and a second floating diffusion region FD2 is connected to the source of the second transfer transistor TG2. The second transfer transistor TG2 transmits the electrons below the second photogate PGB in response to the gate voltage applied to the second photogate PGB. The second transfer transistor TG2 electrically connects or disconnects the second photogate PGB and the second floating diffusion region FD2 in response to a gate signal.

The second floating diffusion region FD2 is connected to the gate of the second source follower S/F2, the power supply voltage VDD is connected to the drain of the second source follower S/F2, and the second select transistor SEL2 is connected to the source of the second source follower S/F2. The voltage of the source of the second source follower S/F2 is determined by the voltage of the second floating diffusion region FD2. The voltage of the second floating diffusion region FD2 is determined by the amount of electrons transmitted from the second photogate PGB.

A row control signal is connected to the gate of the second select transistor SEL2, the source of the second source follower S/F2 is connected to the drain of the second select transistor SEL2, and an output line of the pixel array 10 is connected to the source of the second select transistor SEL2.

The power supply voltage VDD is connected to the drain of the second reset transistor RG2, and the second floating diffusion region FD2 is connected to the source of the second reset transistor RG2 through the second transfer transistor TG2. When the detection of pixel information is performed based on the voltage of the second floating diffusion region FD2 and then the gate of the second reset transistor RG2 is activated by a second reset signal, the second reset transistor RG2 resets the voltage of the second floating diffusion region FD2 to the power supply voltage VDD.

The upper and lower pixels P1 and P2 may be electrically connected between the first photogate PGA and the first transfer transistor TG1 and between the second photogate PGB and the second transfer transistor TG2 by the pixel bonding conductors 302. Specifically, the upper and lower pixels P1 and P2 may be connected between the first photogate PGA and the first transfer transistor TG1 by the first pixel bonding conductor 302a and may be connected between the second photogate PGB and the second transfer transistor TG2 by the second pixel bonding conductor 302b.

The pixel P(i,j) of the 3D image sensor according to some example embodiments of the present disclosure may be configured to have a structure other than that illustrated in FIG. 8.

Figure 9:
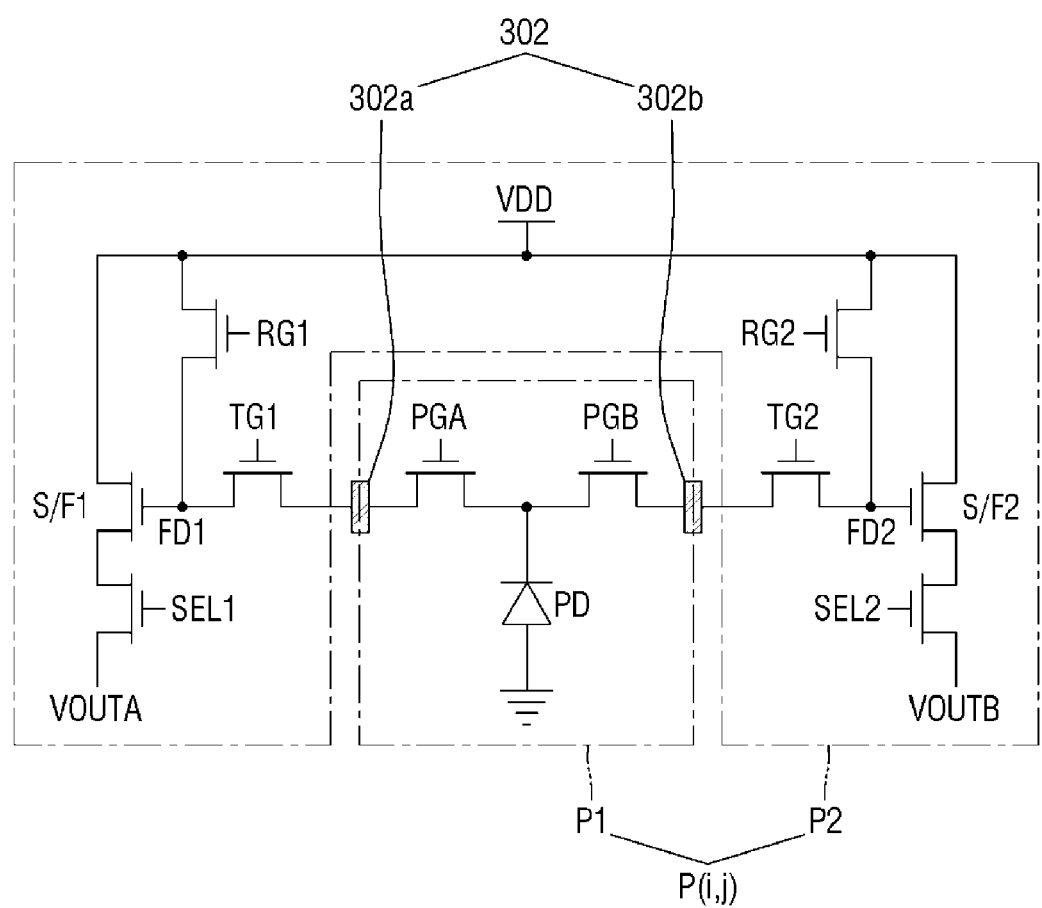
FIG. 9 is an equivalent circuit diagram of another example pixel of the pixel array of FIG. 6.

FIG. 9 is an equivalent circuit diagram of another example pixel of the pixel array of FIG. 6.

Referring to FIG. 9, the first reset transistor RG1 may be connected between the first source follower S/F1 and the first transfer transistor TG1, rather than between the first photogate PGA and the first transfer transistor TG1.

Similarly, the second reset transistor RG2 may be connected between the second source follower S/F2 and the second transfer transistor TG2, rather than between the second photogate PGB and the second transfer transistor TG2.

The pixel P(i,j) may include various circuit configurations to produce the same result.

Referring to FIGS. 7 through 9, the input Vin may include the power supply voltage VDD and the gate voltage of each transistor. That is, the input Vin may include the gate voltages of the first photogate PGA, the first transfer transistor TG1, the first reset transistor RG1, the first select transistor SEL1, the second photogate PGB, the second transfer transistor TG2, the second reset transistor RG2, and the second select transistor SEL2.

The output Vout may include a first output VOUTA and a second output VOUTB.

Figure 10:
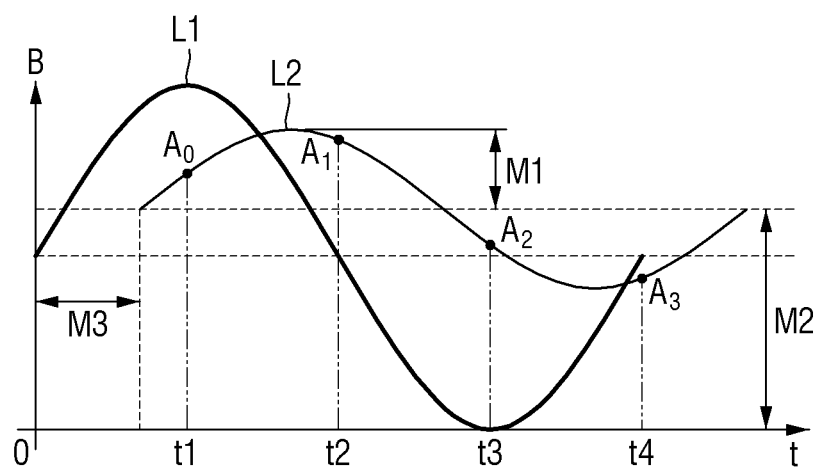
FIG. 10 is a graph for explaining phase sampling of the 3D image sensor according to some example embodiments of the present disclosure.

FIG. 10 is a graph for explaining phase sampling of the 3D image sensor according to some example embodiments of the present disclosure. Referring to FIG. 10, the horizontal axis represents time (t), and the vertical axis represents brightness (B). FIG. 10 shows an example pulse signal L1 and an example reflected pulse signal L2.

Referring to FIGS. 6 and 10, the reflected pulse signal L2 may be sampled at four points, i.e., at points t1, t2, t3, and t4 where the phase of the pulse signal L1 is 0 degrees, 90 degrees, 180 degrees, and 270 degrees, respectively. Values $A_0$, $A_1$, $A_2$, and $A_3$ may be measured at the points t1, t2, t3, and t4, respectively.

Precision information can be obtained from a first measurement value M1. Brightness information can be obtained from a second measurement value M2. Distance information can be obtained from a third measurement value M3.

The 3D image sensor according to some example embodiments of the present disclosure can acquire both color information and distance information of the object O using the $A_0$, $A_1$, $A_2$, and $A_3$ and the first, second, and third measurement values M1, M2, and M3.

Figure 11:
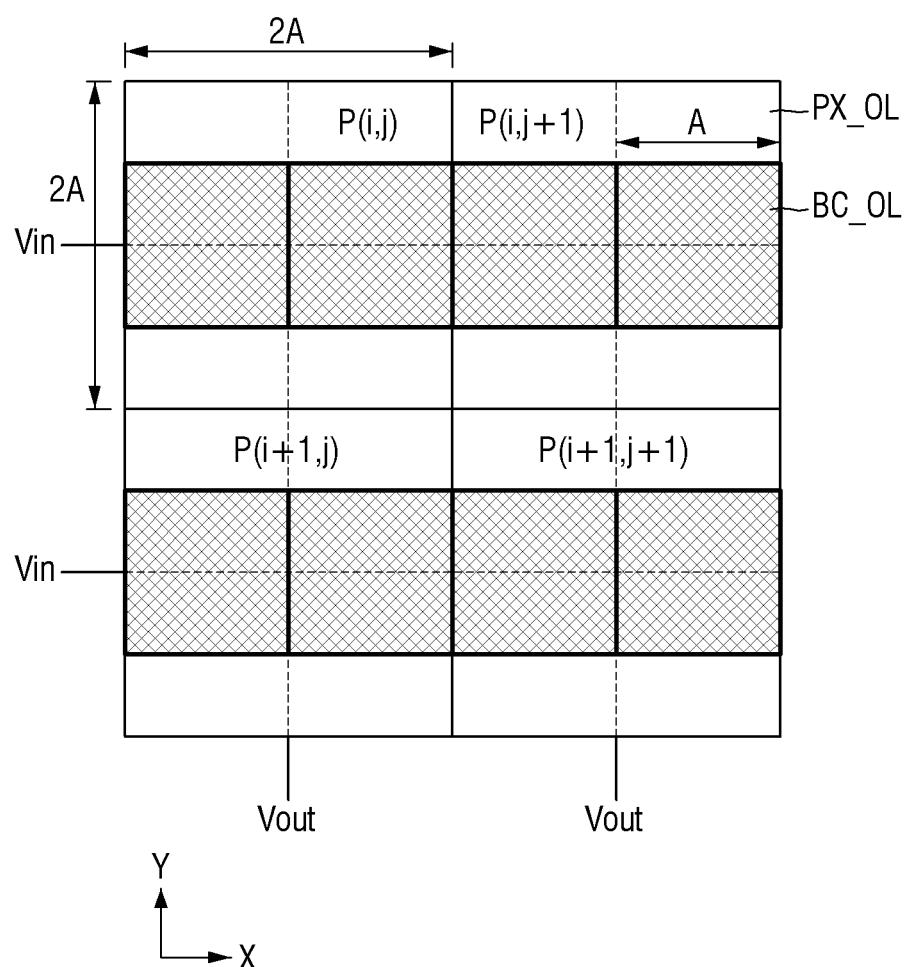
FIG. 11 is a layout view showing the arrangement of pixels and bonding conductors of the 3D image sensor according to some example embodiments of the present disclosure.

FIG. 11 is a layout view showing the arrangement of the pixels and the bonding conductors of the 3D image sensor according to some example embodiments of the present disclosure. FIG. 11 is a layout view in which the outlines of pixels and the outlines of bonding conductors overlap.

Referring to FIGS. 8 and 11, two pixel bonding conductors 302 may be needed for one pixel. In FIG. 11, the pixel P(i,j) is defined by a first outline PX_OL, and the pixel bonding conductors 302 are defined by second outlines BC_OL.

If a first outline PX_OL, which is the outline of the pixel P(i,j), is a square having a length of 2A, two second outlines BC_OL may be provided in the pixel P(i,j) as squares having a length of A.

Each of the second outlines BC_OL simply represents the maximum area that each of the pixel bonding conductors 302 can occupy, and each of the pixel bonding conductors 302 cannot extend beyond, but may not necessarily occupy entirely, the area defined by each of the second outlines BC_OL.

In the 3D image sensors according to some example embodiments of the present disclosure, the elements of each pixel are divided between two substrates, and as a result, the size of each pixel can be reduced. That is, by expanding each pixel in the vertical direction while reducing the horizontal area of each pixel, the resolution and the integration density of the 3D image sensors according to some example embodiments of the present disclosure can both be improved.

A 3D image sensor according to some example embodiments of the present disclosure will hereinafter be described with reference to FIG. 12. Descriptions of elements of the 3D image sensor according to the example embodiment of FIG. 12 that are the same as their respective counterparts of the 3D image sensor according to the example embodiment of FIG. 1 will be omitted or at least simplified.

Figure 12:
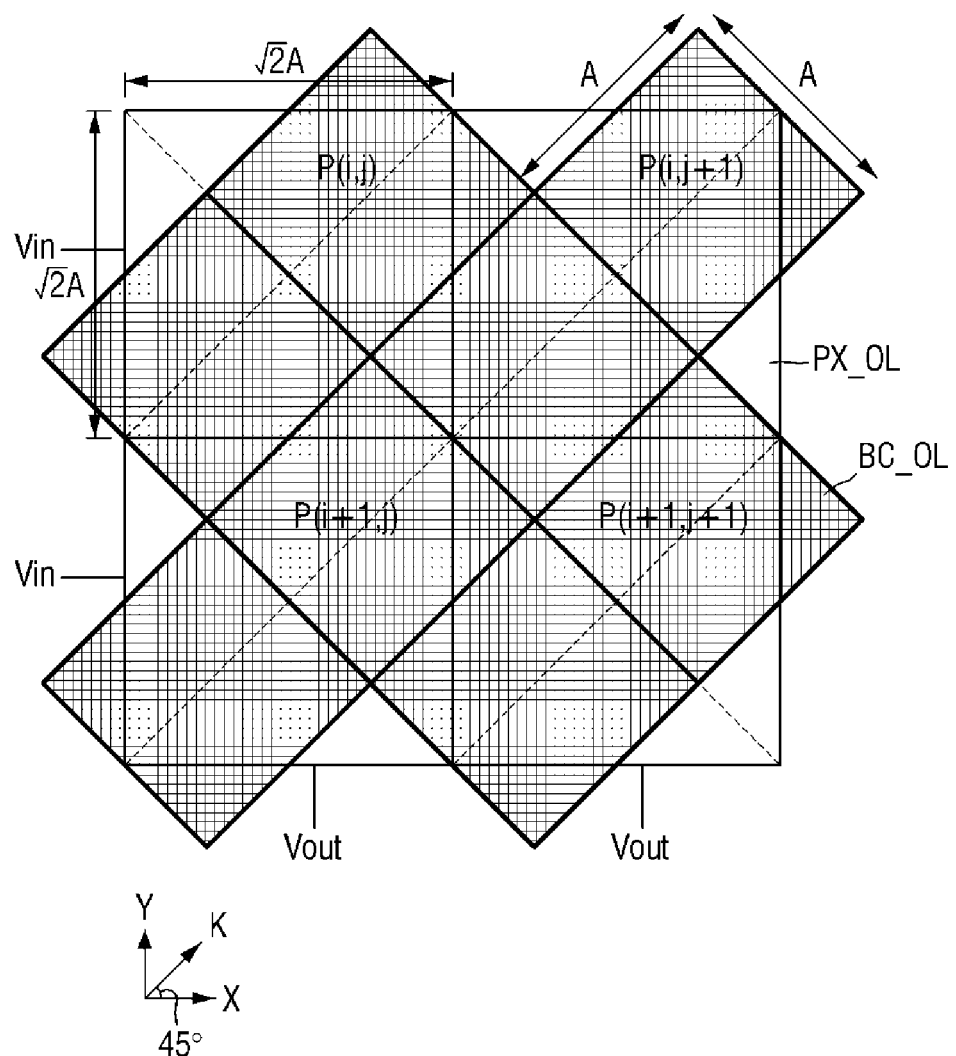
FIG. 12 is a layout view showing the arrangement of pixels and bonding conductors of a 3D image sensor according to some example embodiments of the present disclosure.

FIG. 12 is a layout view showing the arrangement of pixels and bonding conductors of a 3D image sensor according to some example embodiments of the present disclosure.

Referring to FIGS. 1 through 3, 8, and 12, first outlines PX_OL and second outlines BC_OL may be inclined at an angle of 45° with respect to each other.

That is, the first outlines PX_OL may be aligned in rows in a first direction X and in columns in a second direction Y. On the other hand, the second outlines BC_OL may be aligned in rows in a fourth direction K, which is inclined at an angle of 45° with respect to the first direction X. The fourth direction K may also be inclined at an angle of 45° with respect to the second direction Y. The second outlines BC_OL may be aligned in columns in a direction that is inclined at an angle of 45° with respect to the second direction Y and is orthogonal to the fourth direction K.

Pixels in the same row in the first direction X may receive the same input Vin, and pixels in the same column in the second direction Y may share the same output Vout.

The second outlines BC_OL may define regions in which pixel bonding conductors 302 are formed, and if not misaligned, the pixel bonding conductors 302 may be disposed at the centers of the regions defined by the second outlines BC_OL. Thus, since the second outlines BC_OL are aligned in the fourth direction K, the pixel bonding conductors 302 may also be aligned in the fourth direction K. That is, the pixel bonding conductors 302 may form a pixel bonding conductor array having the fourth direction K as its row direction and having the direction orthogonal to the fourth direction K as its column direction.

In a case where the pixel bonding conductors 302 are used, there may be a limit in reducing the size of each pixel because two pixel bonding conductors 302 are needed for each pixel.

However, by arranging the pixel bonding conductors 302 at an inclination of 45° with respect to the pixels, as illustrated in FIG. 12, the length of the sides of each pixel can be reduced from 2A to √2A. As a result, the integration density and the resolution of the 3D image sensor according to the example embodiment of FIG. 12 can both be improved.

A 3D image sensor according to some example embodiments of the present disclosure will hereinafter be described with reference to FIG. 13. Descriptions of elements of the 3D image sensor according to the example embodiment of FIG. 13 that are the same as their respective counterparts of any one of the 3D image sensors according to the example embodiments of FIGS. 1 and 12 will be omitted or at least simplified.

Figure 13:
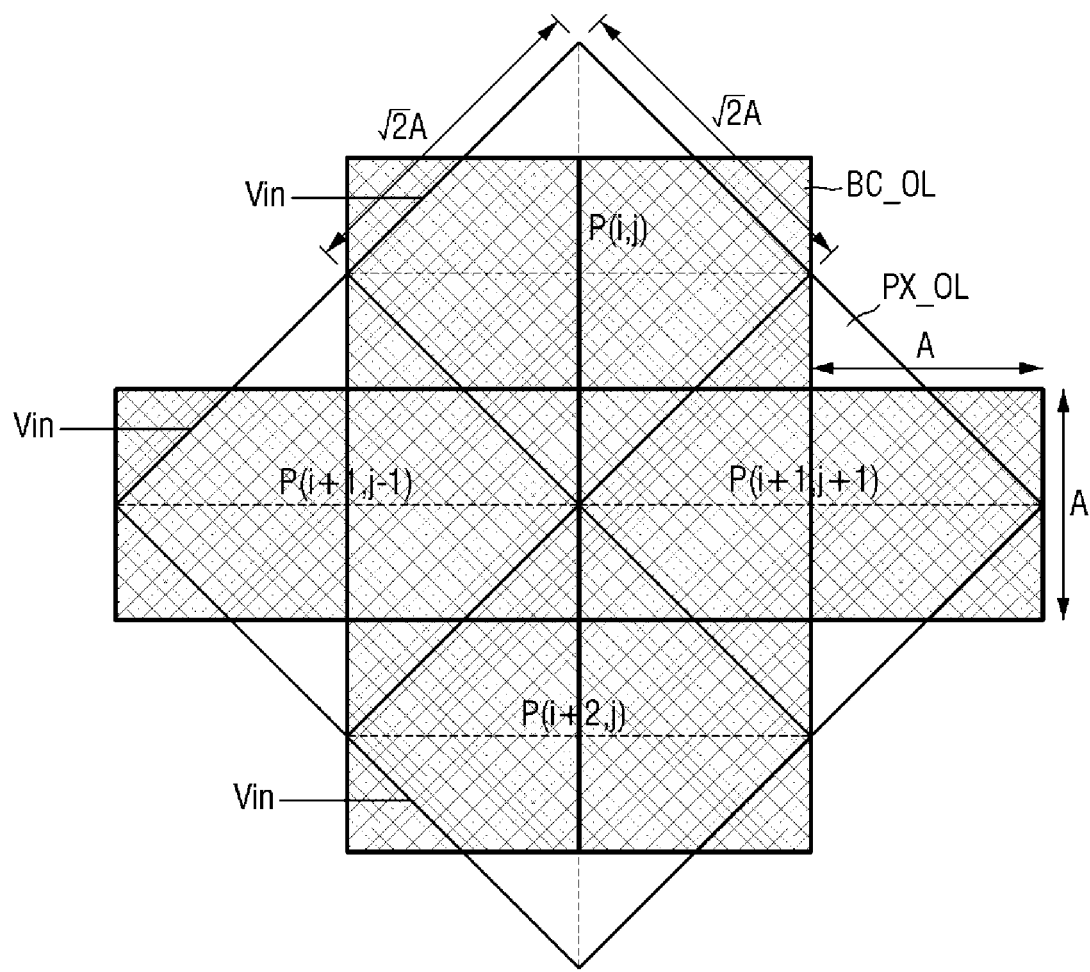
FIG. 13 is a layout view showing the arrangement of pixels and bonding conductors of a 3D image sensor according to some example embodiments of the present disclosure.

FIG. 13 is a layout view showing the arrangement of pixels and bonding conductors of a 3D image sensor according to some example embodiments of the present disclosure.

Referring to FIGS. 1 through 3, 8, and 13, first outlines PX_OL and second outlines BC_OL may be inclined at an angle of 45° with respect to each other.

The first outlines PX_OL may be aligned in a fourth direction K and a direction orthogonal to the fourth direction K, rather than in first and second directions X and Y. On the other hand, the second outlines BC_OL may be aligned in rows in the first direction X and in columns in the second direction Y.

Pixels in the same row in the first direction X may receive the same input Vin, and pixels in the same column in the second direction Y may share the same output Vout.

Due to this arrangement, the horizontal shape of each pixel may be formed as a square in the direction orthogonal to the fourth direction K. Accordingly, the diagonals of a square defined by the horizontal shape of each square may extend in the first and second directions X and Y.

The second outlines BC_OL may define regions in which pixel bonding conductors 302 are formed, and if not misaligned, the pixel bonding conductors 302 may be disposed at the centers of the regions defined by the second outlines BC_OL. Thus, since the second outlines BC_OL are aligned in the first and second directions X and Y, the pixel bonding conductors 302 may also be aligned in the first and second directions X and Y. That is, the pixel bonding conductors 302 may form a pixel bonding conductor array having the first direction X as its row direction and having the second direction Y as its column direction.

In a case where the pixel bonding conductors 302 are used, there may be a limit in reducing the size of each pixel because two pixel bonding conductors 302 are needed for each pixel.

However, by arranging the pixel bonding conductors 302 at an inclination of 45° with respect to the pixels, as illustrated in FIG. 13, the length of the sides of each pixel can be reduced from 2A to √2A. As a result, the integration density and the resolution of the 3D image sensor according to the example embodiment of FIG. 12 can both be improved.

In addition, the distance between wires for applying an input signal to each row of pixels for the input Vin may become smaller than in the 3D image sensor according to the example embodiment of FIG. 12. Accordingly, a 3D image sensor having a higher resolution than the 3D image sensor according to the example embodiment of FIG. 12 can be provided.

A 3D image sensor according to some example embodiments of the present disclosure will hereinafter be described with reference to FIGS. 14 and 15. Descriptions of elements of the 3D image sensor according to the example embodiment of FIGS. 14 and 15 that are the same as their respective counterparts of any one of the 3D image sensors according to the example embodiments of FIGS. 1, 12, and 13 will be omitted or at least simplified.

Figure 14:
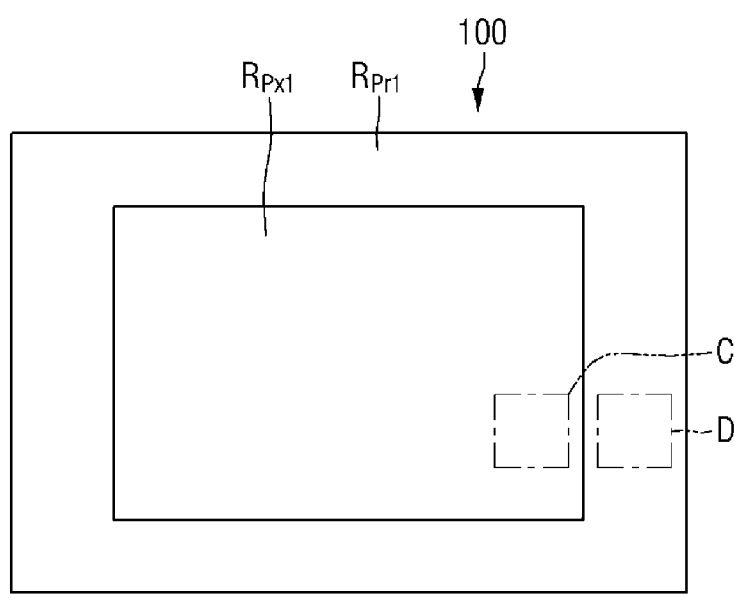
FIG. 14 is a bottom view of a first substrate for explaining a pixel region and a peripheral region of a 3D image sensor according to some example embodiments of the present disclosure.
Figure 15:
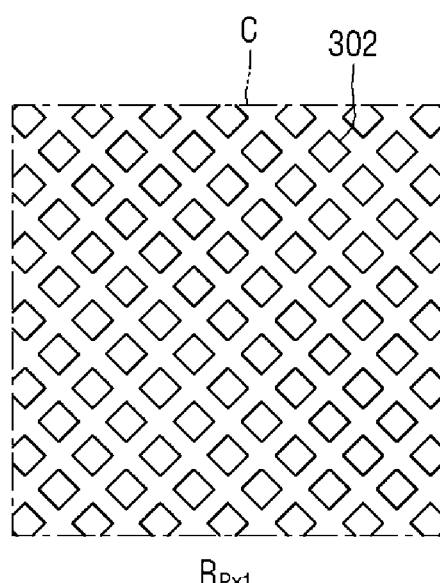
FIG. 15 is a partial layout view showing the arrangement of bonding conductors in parts C and D of FIG. 14.
Figure 15:
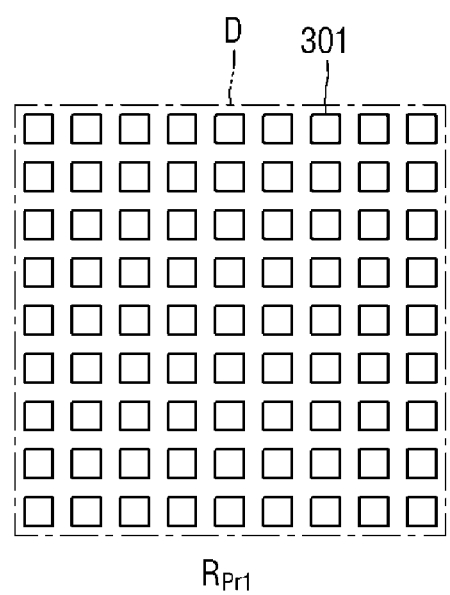

FIG. 14 is a bottom view of a first substrate for explaining a pixel region and a peripheral region of a 3D image sensor according to some example embodiments of the present disclosure, and FIG. 15 is a partial layout view showing the arrangement of bonding conductors in parts C and D of FIG. 14.

Referring to FIGS. 14 and 15, a first substrate 100 may have a first pixel region $R_{Px1}$ and a first peripheral region $R_{Pr1}$. A second pixel region $R_{Px2}$ and a second peripheral region $R_{Pr2}$ of a second substrate 200 have the same layout as the first pixel region $R_{Px1}$ and the first peripheral region $R_{Pr1}$, respectively, of the first substrate 100, and thus, descriptions thereof will be omitted.

In the first pixel region $R_{Px1}$, pixel bonding conductors 302 may be aligned in rows in a fourth direction K and in columns in a direction orthogonal to the fourth direction K. On the other hand, in the first peripheral region $R_{Pr1}$, peripheral bonding conductors 301 may be aligned in rows in a first direction X and in columns in a second direction Y.

Accordingly, the arrangement of the pixel bonding conductors 302 and the arrangement of the peripheral bonding conductors 301 may be inclined at an angle of 45° with respect to each other.

The pixel bonding conductors 302 may be arranged at an inclination in order to reduce the horizontal area of the first pixel region $R_{Px1}$, but the peripheral bonding conductors 301 do not need to be arranged at an inclination and are thus arranged in a non-diagonal direction because the first peripheral region $R_{Pr1}$ may have more room than the first pixel region $R_{Px1}$.

A 3D image sensor according to some example embodiments of the present disclosure will hereinafter be described with reference to FIGS. 14 and 16. Descriptions of elements of the 3D image sensor according to the example embodiment of FIG. 16 that are the same as their respective counterparts of any one of the 3D image sensors according to the example embodiments of FIGS. 1, 12, 13, 14, and 15 will be omitted or at least simplified.

Figure 16:
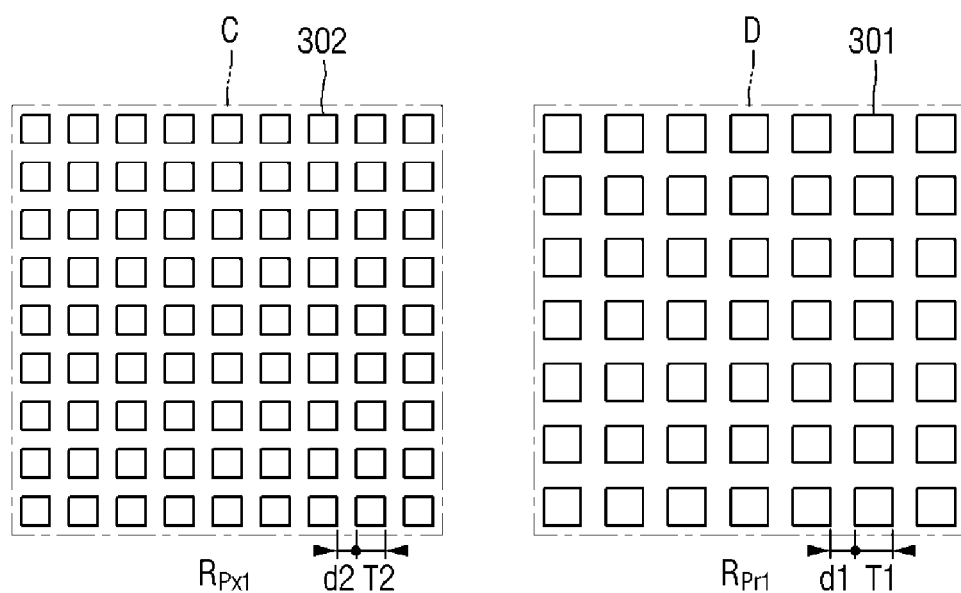
FIG. 16 is a partial layout view showing the arrangement of bonding conductors of a 3D image sensor according to some example embodiments of the present disclosure.

FIG. 16 is a layout view showing the arrangement of bonding conductors of a 3D image sensor according to some example embodiments of the present disclosure. Specifically, FIG. 16 is a partial enlarged layout view showing parts of the 3D image sensor according to some example embodiments of the present disclosure corresponding to parts C and D of FIG. 14.

Referring to FIGS. 14 and 16, a first substrate 100 may have a first pixel region $R_{Px1}$ and a first peripheral region $R_{Pr1}$. A second pixel region $R_{Px2}$ and a second peripheral region $R_{Pr2}$ of a second substrate 200 have the same layout as the first pixel region $R_{Px1}$ and the first peripheral region $R_{Pr1}$, respectively, of the first substrate 100, and thus, descriptions thereof will be omitted.

Pixel bonding conductors 302 in the first pixel region $R_{Px1}$ may have a second thickness T2, and peripheral bonding conductors 301 in the first peripheral region $R_{Pr1}$ may have a first thickness T1. The first thickness T1 may be greater than the second thickness T2.

The difference between the first and second thicknesses T1 and T2 may apply not only to a first direction X, but also to a second direction Y. That is, the peripheral bonding conductors 301 may have a larger horizontal area than the pixel bonding conductors 302.

Specifically, referring to FIG. 5, the peripheral bonding conductors 301 may have larger first pads 310 and larger second pads 340 than the pixel bonding conductors 302. That is, even if the horizontal cross-sectional area of first conductive balls 320 and second conductive balls 330 of the peripheral bonding conductors 301 is the same as the horizontal cross-sectional area of first conductive balls 320 and second conductive balls 330 of the peripheral bonding conductors 301, the first pads 310 and the second pads 340 of the peripheral bonding conductors 301 may be larger than the first pads 310 and the second pads 340 of the pixel bonding conductors 302, but the present disclosure is not limited thereto.

The horizontal cross-sectional area of the first conductive balls 320 and the second conductive balls 330 of the peripheral bonding conductors 301 may also be larger than the horizontal cross-sectional area of the first conductive balls 320 and the second conductive balls 330 of the pixel bonding conductors 302.

This is because the first peripheral region $R_{Pr1}$ may have more room than the first pixel region $R_{Px1}$. Thus, the resistance of the peripheral bonding conductors 301 may become lower.

The pixel bonding conductors 302 in the first pixel region $R_{Px1}$ may be a second distance d2 apart from one another, and the peripheral bonding conductors 301 in the first peripheral region $R_{Pr1}$ may be a first distance d1 apart from one another. The first distance d1 may be greater than the second distance d2.

As already described above, this is also because the first peripheral region $R_{Pr1}$ may have more room than the first pixel region $R_{Px1}$. Accordingly, the fabrication of the peripheral bonding conductors 301 can be facilitated. Also, the risk of misalignment can be reduced, and as a result, the reliability of the transmission of signals can be improved.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

In concluding the detailed description, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

What is claimed is:

1. A three-dimensional (3D) image sensor comprising:
a first substrate including an upper pixel array, a plurality of upper pixels of the upper pixel array are disposed in first rows and first columns of a first arrangement;
a second substrate including a lower pixel array including a plurality of lower pixels; and
a bonding conductor array disposed between the first and second substrates, a plurality of bonding conductors of the bonding conductor array are disposed in second rows and second columns of a second arrangement and electrically connected between the upper pixel array and the lower pixel array,
wherein the second arrangement is inclined at an angle of 45° with respect to the first arrangement.

2. The 3D image sensor of claim 1, wherein the number of the bonding conductors in a pixel unit is same as the number of photogates in the upper pixel of the pixel unit.

3. The 3D image sensor of claim 1, wherein horizontal cross sections of the upper and lower pixels are in a shape of a rectangle and overlap with each other in the vertical direction.

4. The 3D image sensor of claim 3, wherein the bonding conductors are aligned along diagonals of the rectangle.

5. The 3D image sensor of claim 4, wherein
the first arrangement includes rows in a first direction and columns in a second direction in planar,
the second arrangement includes rows in a third direction and columns in a fourth direction in the planar, and
the first direction is inclined to the third direction and the second direction is inclined to the fourth direction.

6. The 3D image sensor of claim 1, wherein
the bonding conductor includes peripheral bonding conductors disposed in a peripheral region and pixel bonding conductors in a pixel region, the pixel region is surrounded by the peripheral region,
wherein a thickness of the peripheral bonding conductor is greater than a thickness of the pixel bonding conductor.

7. The 3D image sensor of claim 6, wherein a distance between the bonding conductors is different from a distance between the peripheral bonding conductors.

8. A image sensing device comprising:
an infrared (IR) emitter emitting an IR light to an object; and
a three-dimensional (3D) image sensor receiving a reflected light via a lens and analyzing color information and distance information of the object,
wherein the 3D image sensor includes a pixel array, the pixel array including
upper pixels disposed in a first substrate and including at least one photogate and at least one photoelectric element to sense the reflected light,
lower pixels disposed in a second substrate and including at least 3 transistors to detect a pixel information from an output signal of the photogate to an electric signal, and
bonding conductor array disposed between the first substrate and the second substrate and electrically connected with the upper pixel and corresponding lower pixel,
wherein an upper pixel array is disposed in rows and columns of a first arrangement and the bonding conductor array is disposed in rows and columns of a second arrangement,
wherein the second arrangement is inclined with respect to the first arrangement.

9. The image sensing device of claim 8, wherein
the first arrangement includes rows in a first direction and columns in a second direction in planar,
the second arrangement includes rows in a third direction and columns in a fourth direction in the planar, and
the first direction is inclined to the third direction and the second direction is inclined to the fourth direction.

10. The image sensing device of claim 8, wherein the number of the bonding conductors in a pixel unit is same as the number of photogates in the upper pixel of the pixel unit.

11. The image sensing device of claim 8, wherein the upper pixel includes at least one photoelectric element converting the reflected pulse signal and at least one photogate outputting an electric signal, and
the lower pixel includes a plurality of transistors to detect the color information and the distance information from electric signal.

12. The image sensing device of claim 11, wherein the bonding conductor is connected across the photogate in the first substrate and a transfer transistor among the plurality of transistors in the second substrate.

13. The image sensing device of claim 11, wherein the upper pixel array includes at least four pixels disposed in rows and columns of the first arrangement,
the bonding conductor array includes at least four bonding conductors disposed in rows and columns of the second arrangement, and
a diagonal length of the first arrangement is same as a horizontal length of the second arrangement.

14. A three-dimensional (3D) image sensor comprising:
a pixel array including a pixel region and a peripheral region; and
peripheral circuits to detect color information and depth information,
wherein the pixel array includes:
upper pixels disposed in a first arrangement in a first substrate,
lower pixels disposed in a second substrate, and
bonding conductor array disposed between the first substrate and the second substrate and electrically connected with the upper pixel and corresponding lower pixel,
wherein the bonding conductor array includes in same planar:
pixel bonding conductors disposed in a second arrangement under the pixel region; and
peripheral bonding conductors in a third arrangement disposed under the peripheral region,
wherein the first arrangement is inclined with respect to the second arrangement.

15. The 3D image sensor of claim 14, wherein the first arrangement includes the pixels disposed in rows in a first direction and columns in a second direction which is orthogonal of the first direction,
the second arrangement includes the pixel bonding conductors in rows in a third direction and columns in a fourth direction which is orthogonal of the third direction,
wherein the first direction and the third direction are inclined with respect to each other.

16. The 3D image sensor of claim 15, wherein the third arrangement includes the peripheral conductors in rows in a fifth direction and columns in a sixth direction which is orthogonal of the fifth direction, and
wherein the third direction and the fifth direction are inclined with respect with each other.

17. The 3D image sensor of claim 15, wherein a thickness of the peripheral bonding conductor is greater than a thickness of the pixel bonding conductor.

18. The 3D image sensor of claim 17, wherein a distance between the pixel bonding conductors is different from a distance between the peripheral bonding conductors.

19. The 3D image sensor of claim 15, wherein the pixel region is surrounded by the peripheral region,
wherein an array of the pixel bonding conductors is surrounded by the peripheral bonding conductors.

* * * * *